US011969992B2

(12) United States Patent
Bargallo et al.

(10) Patent No.: US 11,969,992 B2
(45) Date of Patent: Apr. 30, 2024

(54) PRINTER FOR APPLYING A CONDUCTIVE PATTERN TO A SURFACE

(71) Applicant: HEMPEL A/S, Lyngby (DK)

(72) Inventors: Josep Palasi Bargallo, Kgs. Lyngby (DK); Svava Davidsdottir, Kgs. Lyngby (DK); Mark Terrell Sutton, Kgs. Lyngby (DK); Morten Schnohr, Kgs. Lyngby (DK); Steeven Hegelund Spangsdorf, Kgs. Lyngby (DK); Daria Wagner, Kgs. Lyngby (DK); Frederik Christian Krebs, Kgs. Lyngby (DK)

(73) Assignee: HEMPEL A/S, Kgs. Lyngby (DK)

( * ) Notice: Subject to any disclaimer, the term of this patent is extended or adjusted under 35 U.S.C. 154(b) by 97 days.

(21) Appl. No.: 17/641,597

(22) PCT Filed: Sep. 18, 2020

(86) PCT No.: PCT/EP2020/076150
§ 371 (c)(1),
(2) Date: Mar. 9, 2022

(87) PCT Pub. No.: WO2021/053169
PCT Pub. Date: Mar. 25, 2021

(65) Prior Publication Data
US 2022/0324222 A1 Oct. 13, 2022

(30) Foreign Application Priority Data
Sep. 20, 2019 (EP) ..................................... 19198733

(51) Int. Cl.
*B41J 2/005* (2006.01)
*H05K 3/12* (2006.01)

(52) U.S. Cl.
CPC .......... B41J 2/0057 (2013.01); H05K 3/1275 (2013.01); *B41J 2202/04* (2013.01); *H05K 2203/0134* (2013.01)

(58) Field of Classification Search
CPC ........ B41J 2/0057; B41J 2202/04; B41J 3/00; B41J 25/00; B41J 29/38; H05K 3/1275;
(Continued)

(56) References Cited

U.S. PATENT DOCUMENTS 3,308,475 A 3/1967 Bean
4,479,432 A 10/1984 Masaki et al.
(Continued)

FOREIGN PATENT DOCUMENTS

CN 102673101 A 9/2012
CN 102858541 A 1/2013
(Continued)

OTHER PUBLICATIONS

International Search Report and Written Opinion from PCT Application No. PCT/EP2020/076150, dated Nov. 23, 2020.
(Continued)

*Primary Examiner* — Bradley W Thies
(74) *Attorney, Agent, or Firm* — Workman Nydegger (57) ABSTRACT

A printer is configured for printing with conductive ink for applying a conductive pattern to a surface including a wheeling structure for moving the printer over the surface and a transfer unit for applying a layer of electrically conductive ink to the surface. To provide accurate printing with the ability to obtain fine tolerances, the transfer unit has a printing drum rotatable about a printing drum axis and defining a printing drum periphery moving between a first zone and a second zone by rotation of the printing drum. The
(Continued)

printing drum periphery, in the first zone, receives the conductive ink and in the second zone transfers the ink to the surface.

15 Claims, 6 Drawing Sheets

(58) Field of Classification Search
CPC .. H05K 2203/0134; B41F 19/005; B41F 5/24
See application file for complete search history.

(56) References Cited

U.S. PATENT DOCUMENTS

| | | | |
|---|---|---|---|
| 5,593,236 | A | 1/1997 | Bobry |
| 5,853,251 | A | 12/1998 | Imai |
| 2002/0158955 | A1 | 10/2002 | Hess et al. |
| 2012/0227598 | A1 | 9/2012 | Miura |
| 2013/0019768 | A1 | 1/2013 | Mihashi et al. |
| 2015/0158287 | A1 | 6/2015 | Sakamoto et al. |
| 2015/0226579 | A1 | 8/2015 | Nino et al. |
| 2016/0002868 | A1* | 1/2016 | McGuffie ............ E01C 23/203 427/137 |

FOREIGN PATENT DOCUMENTS

| | | |
|---|---|---|
| CN | 104302480 A | 1/2015 |
| CN | 204184029 U | 3/2015 |
| KR | 20110120638 A | 11/2011 |
| WO | 8001151 A1 | 6/1980 |
| WO | 2011076856 A1 | 6/2011 |
| WO | 2018/020204 A1 | 2/2018 |
| WO | 2019/102398 A1 | 5/2019 |

OTHER PUBLICATIONS

European Search Report from corresponding EP Application No. 19198733, dated Feb. 25, 2020.

* cited by examiner

PRINTER FOR APPLYING A CONDUCTIVE PATTERN TO A SURFACE

INTRODUCTION

The disclosure relates to a printer for applying a conductive pattern to a surface.

BACKGROUND

A large variety of structures made e.g. of steel or concrete are covered with a coating system comprising one or more layers of a "cured coat". The cured coat may serve different purposes, i.a. protection against atmospheric degradation (corrosion, fading, UV-caused degradation etc.), reduction of fouling, abrasion resistance, prevention of reflection, fire retardation, or simply providing an aesthetic appearance.

Under ideal conditions, the coating system exhibits a predefined, intended characteristic, e.g. a specific level of protection against ingress of air, water, or corrosive species, and it therefore preserves the intended condition of the structure. Over time, cracks, deterioration, or various defects in the coating reduce the intended effect, and scheduled maintenance or repair is therefore often necessary.

Sensors are sometimes applied to monitor degradation of the structure or the coating applied to the structure or for monitoring degradation or failure of the protected surface and mechanical defects or internal stress. Different principles are applied depending on the needed accuracy and depending on the type of degradation being in focus. For corrosion sensing purpose, Corrosion Coupons, Electrical Resistance, Galvanic current or voltage, or Electrochemical Impedance Spectroscopy (EIS) are examples of existing technologies.

The known principles of monitoring typically use one or more sensing elements in the form of electrically conductive electrodes carried by a substrate. The substrate is typically non-conductive. The substrate could be a sheet of a polymer material which carries the sensing element, and it is placed with the sensing element in the coated structure, on the coated structure, or in the vicinity of the coated structure, and the monitoring is carried out, e.g. by measuring a weight-loss, an electrical resistance, a galvanic current or voltage, or an electrical impedance spectroscopy.

The quality of the monitoring defines the predictability and thereby how well the obtained measurement reflects the condition of the coated object. The quality depends on different aspects, inter alia the type of sensing element, the position of the sensing element, and the principle of sensing.

Variations in the sensing element, e.g. non-uniform shape and size of electrodes may lead to variations in the signal and a reduced monitoring quality.

SUMMARY

It is an object of embodiments of the present disclosure to increase the quality of monitoring. It is a further object to improve the process of applying electrodes to a surface. It is a further object to increase usability in various kinds of environment and in various orientations.

According to these and other objects, the disclosure, in a first aspect, provides a printer configured for printing with conductive ink for applying a conductive pattern to a surface, the printer comprising a wheeling structure for moving the printer over the surface and a transfer unit for applying a layer of electrically conductive ink to the surface. The transfer unit comprises a drum which is rotatable about a printing drum axis and which defines a printing drum periphery moving between a first zone and a second zone by rotation of the printing drum, wherein the periphery, in the first zone receives the conductive ink and in the second zone transfers the ink to the surface.

Due to the combination between the wheeling structure and the transfer unit, both the wheeling and the application of conductive ink is carried out by rotation of an element relative to the surface, and that provides an accurate printing with the ability to obtain fine tolerances. This is essential when printing electrodes for sensing purpose and it is a key to obtaining more accurate sensing of the condition of the structure or of the coating applied to the structure.

The printer is configured for printing with a conductive ink which, herein, means that the printer includes a supply of the conductive ink. The conductive ink could be ink containing Silver e.g. in the form of silver particles or silver nano-wires, or it could contain Carbon e.g. in the form of carbon black, graphene, graphite, carbon or nano-tubes. Further, the ink may be based on Zinc and may contain zinc flakes, or zinc oxide, it could be based on gold and contain gold particles, it could be based on titanium and contain titanium particles, it could be based on aluminium and contain aluminium particles, it could be based on molybdenum and contain molybdenum particles, it could be based tungsten and contain tungsten oxide. The ink could contain Ionic liquid. Further, the ink could be a mixture of any of the mentioned ink types.

Figure 11:
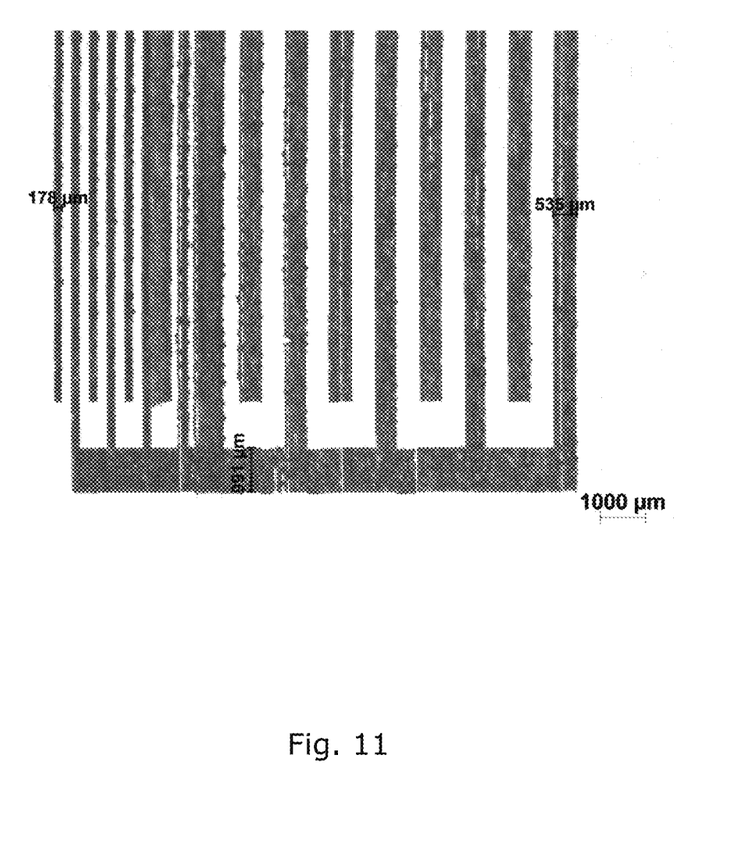
FIG. 11 illustrates a microscope picture of a reference pattern made by an inkjet printer.

When conductive particles are included in the ink, the particle may more easily connect and form a continuous path of conductive particles which are arranged in the ink when using a drum as opposed to e.g. an inkjet nozzle. If an inkjet nozzle had been used, very fine conductive grains may block the nozzle due to size of the conductive particles or grain. There is trade off using inject printer if the nozzle size is small the particle might not connect resulting in interruption of conductivity. If the nozzle size is big the dots might smear out causing short circuit in the sensors or a reduced level of contact between particles, and if very coarse particles are used, good contact may be obtained but with low tolerances. FIG. 11 illustrates a conductive pattern printed by an inkjet printer and illustrates how the dots formed by the inkjet printer makes the pattern less precise with more defuse edges and a higher degree of non-uniformity. Even though the pattern looks sharp and nice with the naked eye, it is clear when viewed under a microscope that the lines are not precise. In worst case, the pattern is separated into several unconnected parts, breaking the electrical connection.

The term "wheeling structure" when used herein means any kind of movement of the printer on the surface e.g. by frictional interaction with the surface. Examples include rolling over the surface by wheels, belts or similar structures, or rolling over the surface by ball shaped rollers etc., or generally rolling over the surface with any kind of rolling structure. The wheeling structure may include power driven means for effecting the movement, e.g. in the form of electrically driven motors etc. In one embodiment, the wheeling structure is constituted by four wheels having a high frictional outer periphery e.g. made of soft rubber or similar material. The wheels are driven by an electric motor and preferably, at least two or all four wheels are driven with the same rotational speed.

The transfer unit comprises a printing drum defining a printing drum periphery moving between a first zone and a second zone by rotation of the printing drum. In the first zone, the printing drum periphery receives the conductive ink and in the second zone, the printing drum periphery transfers the ink to the surface. The periphery of the printing drum may preferably be made of a polymer material having a first porosity, a first modulus of elasticity, a first coefficient of friction, and a first durometer hardness. The printing drum could be made of rubber such as Viton (Viton is a brand of FKM), e.g. in a heavily crosslinked version. The hardness could be 50-95 shore such as 65 Shore for avoiding any deformation.

The printing drum may be driven by an electrical motor, e.g. the same motor which drives the wheeling structure, or with a separate motor. Electrical motors used in the printer may e.g. be ATEX certified motors, e.g. brushless motors.

The use of a printing drum for transfer of the conductive ink enables printing at different angles relative to gravity, and therefore improves usability of the printer on uneven surfaces and on different inclinations. To further improve the ability to print on uneven surfaces, the printing drum may have a significant higher elasticity than the transfer drum [(Elongation ($\times 10^3$ psi) of printing drum: 0.1 to 1.5 (0.7 to 10.3 MPa.)). The printing drum coefficient of friction may be in the range of 0.57-0.77 with static friction vs steel and 0.24-0.42 with dynamic frication vs steel. The first durometer hardness may be in the range of 50 to 95 Shore.

The printing drum may include a 3-dimensional pattern in the printing drum periphery. The pattern defines the conductive pattern.

The printer may further comprise a transfer drum arranged for rotation about a transfer drum axis, e.g. rotation synchronously with the printing drum. The transfer drum axis may be parallel to the printing drum axis. The transfer drum has an outer transfer drum periphery moving between a third zone and a fourth zone, the fourth zone being submersed in a bath comprising the conductive ink and the third zone being in communication with the first zone of the printing drum to transfer ink from the transfer drum to the printing drum. The transfer drum enables exact dosage of the conductive ink at different inclinations and further improves the ability to print with fine tolerances at different conditions, including outside, on surfaces having varying texture and inclination etc.

The transfer drum may include a 3-dimensional pattern in the transfer drum periphery. The pattern defines the conductive pattern which is transferred to the printing drum.

The 3-dimensional print pattern on the printing drum or on the transfer drum may define elongated conductors extending in an oblong direction. The wheeling structure may comprise wheels arranged to move the printer in the oblong direction or in a direction perpendicular to the oblong direction. The particularly moving direction relative to the oblong direction of the elongated conductor enables high printing precision and therefore lower tolerances on the printed pattern.

The mentioning of the third zone being in communication with the first zone means that the transfer drum periphery and the printing drum periphery are sufficiently close to each other for ink to be transferred. In one embodiment, the peripheries are in direct contact.

The periphery of the transfer drum may preferably be made of a non-polymer material, e.g. a ceramic material having a second porosity, a second modulus of elasticity, a second coefficient of friction, and a second durometer hardness which is high compared to the first durometer hardness, e.g. in the range of the durometer hardness of iron oxide or tungsten. The porosity may be in the range of 1.5-50 micron, such as 25 micron.

The transfer drum may be driven by an electrical motor, e.g. the same motor which drives the printing drum and/or the wheeling structure, or with a separate motor. Electrical motors used in the printer may e.g. be ATEX certified motors, e.g. brushless motors.

The use of a transfer drum for transfer of the conductive ink to the printing drum enables printing at different angles relative to gravity, and it improves the preciseness relative to the layer thickness of the ink which is applied on the printing drum. It therefore further improves usability of the printer for very precise application of conductive patterns, and in combination with the printing drum, it enables precise application also on uneven surfaces and on different inclinations. To further improve the ability to print precise patterns, the first elasticity may be superior to the second elasticity, meaning that the printing drum periphery is more elastically deformable than the transfer drum periphery. The first coefficient of friction may be superior to the second friction coefficient, meaning that the friction is higher on the printing drum periphery than on the transfer drum periphery. The second porosity may be superior to the first porosity, meaning that the transfer drum periphery is more porous and open in its structure than the printing drum periphery. The second durometer hardness may be superior to the first durometer hardness, meaning that the transfer drum periphery is harder than the printing drum periphery.

A doctor blade may be arranged to scrape off ink from the transfer drum periphery between the third and fourth zones to thereby provide a more even layer thickness.

The printer may comprise a first distance adjustment means configured for defining a distance between the surface and the printing drum periphery.

The first distance adjustment means may be arranged to change a distance between the wheeling structure and the printing drum. Particularly, the first distance adjustment means may enable lifting and lowering of the printing drum relative to the surface on which the wheeling structure moves the printer. Accordingly, the first distance adjustment means may move the printing drum in a particular direction relative to the wheeling structure, herein referred to as an upwards direction.

In one embodiment, the transfer unit which contains the printing drum and optionally contains the transfer drum is rotatable relative to the wheeling structure about a hinge axis which is parallel to the printing drum axis and the transfer drum axis, and rotation is effected by the first distance adjustment means. The first distance adjustment means may particularly be configured to finely adjust the height of the printing drum over the surface. For that purpose, at least one of the printing drum axis and the transfer drum axis may be between the hinge axis and the first distance adjustment means, and the distance from the hinge axis to the printing drum axis may preferably be at least the same as the distance from the printing drum axis to the first distance adjustment means.

The first distance adjustment means may comprise a height adjustment motor for automatic operation. The first distance adjustment means may further comprise a height sensor for determining a distance between the printing drum and the surface and configured to operate the height adjustment motor. The height sensor may comprise an optical sensor, e.g. a laser, or it may determine an electrical potential between the printing drum and the surface and control the height adjustment motor based on the potential.

The printer may comprise a second distance adjustment means configured for defining a distance between the printing drum periphery and the transfer drum periphery. In one embodiment, the first distance adjustment comprises two adjustment structures, one for moving one end of the transfer drum axis relative to the printing drum axis and one for moving the opposite end of the transfer drum axis relative to the printing drum axis. This enables not only adjustment of distance between the printing drum periphery and the transfer drum periphery but also adjustment of the angle between the transfer drum axis and the printing drum axis and thereby tuning of parallelism between the axes.

The printer may comprise a third distance adjustment means configured for defining a distance between the doctor blade and the transfer drum periphery and thus allowing adjustment of the layer thickness of the conductive ink. In one embodiment, the third distance adjustment comprises two adjustment structures, one for moving one end of the doctor blade relative to the transfer drum periphery and one for moving the opposite end of the doctor blade relative to the transfer drum periphery. This enables not only adjustment of thickness of the ink layer but also evenness of the ink layer, i.e. how constant the thickness is from one side of the printed conductive pattern to the opposite side of the conductive pattern.

The printer may further comprise magnetic or pneumatic attraction means for establishing attraction between the printer and the surface. This enables a more exact printing by preventing lifting of the printer from the surface and therefore further facilitates the desired accuracy when printing conductive patterns. Further, it enables printing on items oriented indifferent directions relative to gravity. Particularly, the combination between the printing drum and magnetic or pneumatic attraction means enables multiple orientations and high accuracy, and the optional transfer drum further improves this aspect of the printer.

Magnetic attraction means may be a possible solution when printing on steel surfaces and may comprise a magnet arranged adjacent to each wheel or roll of the wheeling structure. The magnetic attraction means may comprise a magnet height adjustment enabling adjustment of the distance from each magnet to the surface. This enables adjustment for an optimal balance between desired attraction force and an uneven surface. In one embodiment, the magnetic attraction means is provided by electro-magnets to thereby enable electrical adjustment of the attraction force.

Pneumatic attraction may be provided by a pressure pump configured to evacuate one or more spaces between the printer and the surface. The pump could be electrically controlled based on the pressure in the space(s) to thereby adjust the attraction force.

Since usability in various kinds of environment and in various orientations is an aspect, it may be an advantage to reduce gravitational impact on the orientation of the printer. For that purpose, the distance between the mass-centre point and the geometrical centre point of the printer may be lower than the distance between the printing drum axis and the transfer drum axis. That will reduce the tendency of the printer to change orientation based on gravitational impact when in use. Particularly, the distance between the mass-centre point and the geometrical centre point of the printer may be lower than 50 percent of the distance between the printing drum axis and the transfer drum axis.

The transfer unit may be removable as one component from the wheeling structure. This will allow replacement of the transfer unit e.g. for rapid replacement with a transfer unit configured for another conductive pattern. Since the transfer unit, in that way, can be configured specifically for one conductive pattern, it may increase precision and quality further.

The printing drum may comprise the aforementioned 3-dimensional pattern defining the conductive pattern. Additionally, the printing drum may comprise a reference mark. The printing drum may be controlled by a printing controller configured to adjust the position of the printing drum based on the reference mark. Particularly, the printing controller may be configured to position one printed conductive pattern at a specific location relative to another conductive pattern, e.g. at a specific distance from each other by resetting the reference mark applying the first pattern, and by resetting the reference mark at a predetermined reference location for the next pattern and subsequently applying the subsequent pattern.

The wheeling structure may comprise a set of wheels each being rotatable about a rotation axis, and wherein each wheel can be tilted about a tilt axis perpendicular to the rotation axis. Tilting of the wheels may increase the ability to use the printer on curved surfaces, e.g. on outer surfaces of pipes etc.

The printer may comprise indication marks indicating a degree of tilting of the wheels about the tilt axis, and the printer may comprise automatic adjustment means compensating for curved surfaces automatically by setting each wheel a specific angle, e.g. perpendicular to the surface.

The printer may comprise a control system configured for moving the printer in a controllable path. The control system may be included in a central processing unit (CPU) which may be programmable for executing a predefined sequence of movements. The control system may control at least one of the wheeling structure, rotation of the printing drum, rotation of the transfer drum, and one of the height adjustment or distance adjustment means.

Besides the CPU and control system, the device may further comprise a user input means configured to enable a user to specify at least one of the following: a specific speed of the wheeling structure, a specific height of the printing drum over the surface, a specific distance between the transfer drum and the printing drum, and a specific distance between the doctor blade and the transfer drum.

In one embodiment, the control system contains information related to or is configured to receive information related to a curing time of the conductive ink, and to define the speed of the wheeling structure based on a programmed ratio between moving speed and curing time.

In one embodiment, the control system contains information related to, or is configured to receive information related to geometry of the conductive pattern, e.g. height, width etc. and to define the speed of the wheeling structure based on a programmed ratio between one or more of such dimensions and moving speed.

Curing means may be included in the printer for applying energy to cure the ink at the second zone. Such means may comprise means for transmitting light, thermal energy, and/or vibration, or means for co-eluting a curing agent etc., and it may be arranged at the surface, e.g. included in the printing drum. In one embodiment, the printing drum is transparent or translucent and includes a light, e.g. with a high UV transmission rate and configured to emit light through that part being at the second zone.

The printer may comprise a storage for conductive ink, e.g. in the form of a replaceable cassette allowing fast replacement of ink, e.g. for refilling the printer or for shifting from one type of conductive ink to another type of conductive ink.

The conductive ink may be a liquid or paste-like substance with a viscosity allowing it to be spread on the surface by the printing drum and to solidify thereon.

The 3-dimensional print pattern formed on the printing drum periphery may define at least a first sensor and a second sensor, e.g. in the form of a first electrode and a second electrode. If the printed pattern constitutes electrodes, then the first and the second electrodes may be defined such that they are separated from each other. The printing drum may e.g. comprise a removable rubber belt defining the print pattern, the rubber belt being circumferentially wrapped about a peripheral surface of the printing drum.

The printer may comprise a print quality inspection system configured to control online the printed conductive pattern. If the pattern is constituted by two electrodes separate from each other, the print quality inspection system may be configured to control online if a distance between the first electrode and the second electrode is within a predefined threshold. In one embodiment, the print quality inspection system comprises a camera and a CPU programmed to analyse the image from the camera and compare it with a reference image, and to generate an error code based on the comparison. In another embodiment, the quality inspection structure comprises a multi-meter arranged to communicate electrical signals with the conductive pattern printed by the printer. The inspection structure may further comprise a CPU programmed to analyse a signal from the multi meter and compare it with a reference signal, and to generate an error code based on the comparison.

Energy for motors, control systems, heaters, light, electromagnets or other powered equipment may be provided by batteries, e.g. lithium ion batteries.

The printer may comprise an outer encapsulation leaving only an opening at the second zone to allow transfer of the conductive ink to the surface. The printer may further comprise pressurisation means for pressurising the encapsulation and thereby prevent intrusion of dust or other particles which may reduce the quality of the conductive pattern printed by the printer. The pressure may further prevent intrusion of explosive gas and thus enable safe operation e.g. in hazardous areas.

In a second aspect, the disclosure provides a method of applying a pattern of electrically conductive ink to a surface by use of the printer according the first aspect. According to this method, a first and a second separate electrode are formed by electrically conductive ink which is transferred to the surface by the printing drum.

The ink may be cured and the separation of the first electrode from the second electrode is tested by the printer.

In a third aspect, the disclosure provides an electrically conductive pattern comprising a first electrode and a second electrode, the first and second electrodes being separate from each other, and the pattern being applied by a printer according to the first aspect.

The disclosure further provides a coated structure comprising said electrically conductive pattern. The coated structure comprises a base with a base surface which is protected by coating.

The base may e.g. be an item made of steel, carbon fibres, composite materials, or concrete, e.g. part of a ship, a pipe, a pressure vessel, a ballast or storage tank, a bridge, a wind blade, an airplane, a car, or any similar kind of structure for which coating systems are typically used to protect against degradation or to improve appearance. It follows that when the sensors are used for monitoring corrosion, the base is a corrodible material such as steel.

The disclosure may particularly relate to structures where traditional inspection is difficult and expensive. This applies particularly to structures which are difficult to access.

In one embodiment, the coated structure is a storage tank or a ballast tank or a partly or fully submersible structure, such as a vessel or a semi-submersible oil rig. The inside of tanks is generally prone to corrosion due to the presence of water or water vapour, typically sea water, when ballast is required. Proactive monitoring of tanks and ballast tanks is costly since they are difficult to access and they have to be taken out of operation during inspection. Examples of partly or fully submersible structures include vessels (including but not limited to boats, ocean liners, tankers, container ships and other cargo ships, submarines and naval vessels of all types), offshore oil facilities, offshore wind power generation facilities, and subsea pipelines.

The coating could be constituted by any type of coatings etc., particularly one or two component coatings for steel, or concrete, such as coating systems for reducing water diffusion. The latter are well known e.g. for pipe protection or protection in water ballast tanks of ships.

The coating may comprise a resin matrix material forming the binder, e.g. an acrylic polymer, an alkyd polymer, or an epoxy polymer. The coating may e.g. comprise the following binders: Acrylic, epoxy, polyaspartic, polyurethane, polysiloxane, alkyd, zinc silicate, silicone, polyuria Hybrid technologies: epoxy/acrylic, epoxy/siloxane, epoxy/zinc silicates.

The coating may comprise a pigment, e.g. providing colour or constituting filler material. Any colour of the pigment may be considered, e.g. yellow, orange, red, violet, brown, blue, green, or black which are part of the official pigment numbering system e.g. described as pigment white xxx (x=1 to 999), pigment yellow xxx (x=1 to 999), pigment orange (x=1 to 999), pigment red xxx (x=1 to 999), pigment brown (x=1 to 999), pigment violet (x=1 to 999), pigment green (x=1 to 999), pigment blue P.B. (x=1 to 999), pigment black (x=1 to 999) or the like.

Examples of such pigments are: zinc oxide, zinc containing phosphate and polyphosphate, iron oxide, aluminium containing phosphate, zinc borate, graphite, carbon black oxide, coated mica, fluorescent pigments, cuprous oxide, aluminium paste pigment (leafing and non-leafing type), metallic pigments, zinc dust, organic pearl pigment, ammonium polyphosphate, coloured silica sand, polyacrylic acid/calcium carbonate, azo-, phthalocyanine and anthraquinone derivatives (organic pigments), and titanium dioxide (titanium(IV) oxide), etc.

The coating may e.g. comprise the following fillers: Carbonates such as: Calcium carbonate, calcite, dolomite (=calcium/magnesium carbonate), magnesium silicate/carbonate, polycarbonate. Included are also mixtures, calcined grades and surface treated grades. Silicates such as: Aluminium silicate (kaolin, china clay), Magnesium silicate (talc, talc/chlorite), Potassium Aluminium silicate (plastorite, glimmer), Potassium Sodium Aluminium silicate (nepheline syenite), Calcium silicate (wollastonite), Aluminium silicate (bentonite), phyllo silicate (mica). Oxides: Silicon dioxide such as quartz, diatomite, metal oxides such as calcium oxide, aluminium oxide, iron oxide and micaceous iron oxide. Hydroxides/hydrates such as: Aluminium hydroxide, Aluminium trihydrate, Sulphates: barium sulphate. Other fillers: Barium metaborate, silicon carbide, Perlite (volcanic glass), Glass spheres (solid and hollow), glass flakes, glass and silicate fibres, organic fibres, polyvinylidene chloride acrylonitrile, polystyrene acrylate.

Included are also mixtures of the above fillers as well as grades which are natural, synthetic, calcined or surface treated.

The coating system could comprise several layers of cured coats, e.g. including a primer, e.g. an anticorrosive primer applied to the base surface. The base surface could, initially, be treated e.g. by abrasive blasting. On top of one or more layers of primer, the coating may include one or more layers of an intermediate coat such as a coating which promotes adhesion, and/or one or more layers of a top coat. The top coat could e.g. comprise one or more layers of a fouling control surface coating system, which is particularly useful for marine structures. Additionally, one or more layers of a tie-coat could be applied under the top coat.

The anticorrosive primer could for example be an epoxy-type anticorrosive primer, and it may be a zinc containing or zinc-free primer. The tie-coat could also be an epoxy, silicone, or polyurethane based tie-coat. The fouling control surface coating system may e.g. comprise one or more antifouling coats, or a silicone system, where the silicone system can comprise similar or different layers of silicone coating systems.

The electrodes could be arranged between such different layers of coats and thus embedded in the coating system.

In one embodiment, a printed electrically conductive pattern is applied by the printer directly on the uncoated surface of the base and subsequently, a coating is applied and allowed to cure.

In another embodiment, a printed electrically conductive pattern is applied by the printer on top of a layer of cured coat. Embedment of an electrode between two cured coats can be obtained by application of the electrode material on the first cured coat e.g. as a printed pattern made from a conductive ink and then subsequently applying a second coating layer to form a second cured coat. By that the electrodes can be arranged between different types of coats.

LIST OF DRAWINGS

In the following, embodiments of the invention will be described in further details with reference to the drawing in which.

DESCRIPTION OF EMBODIMENTS

It should be understood that the detailed description and specific examples, while indicating embodiments of the invention, are given by way of illustration only, since various changes and modifications within the spirit and scope of the invention will become apparent to those skilled in the art from this detailed description.

Figure 1:
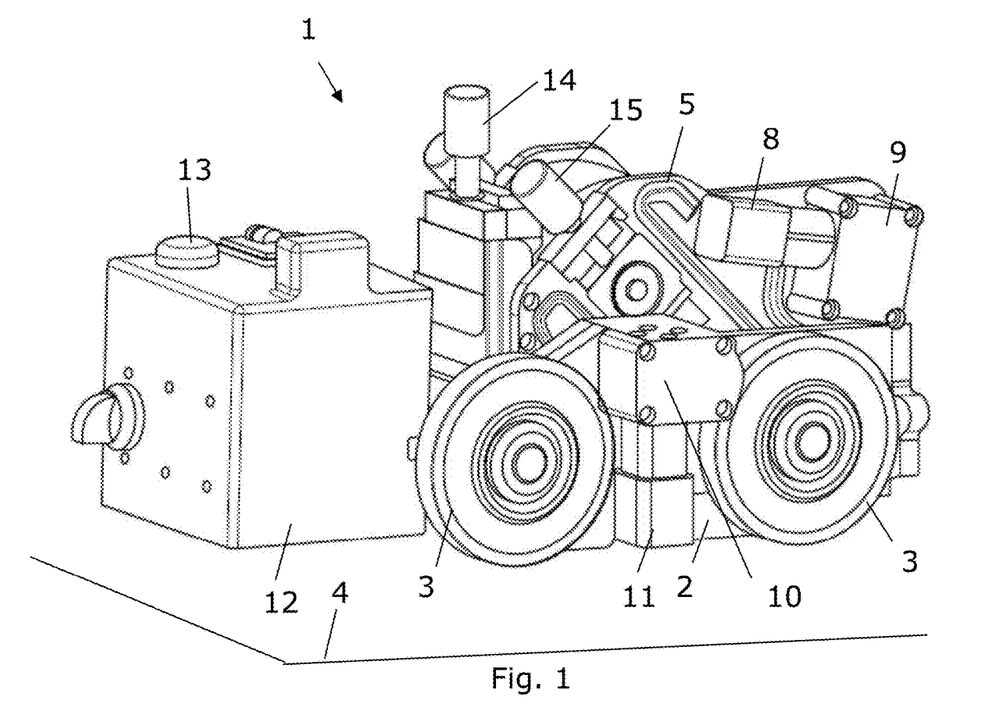
FIG. 1 illustrates a printer in a perspective view.
Figure 2:
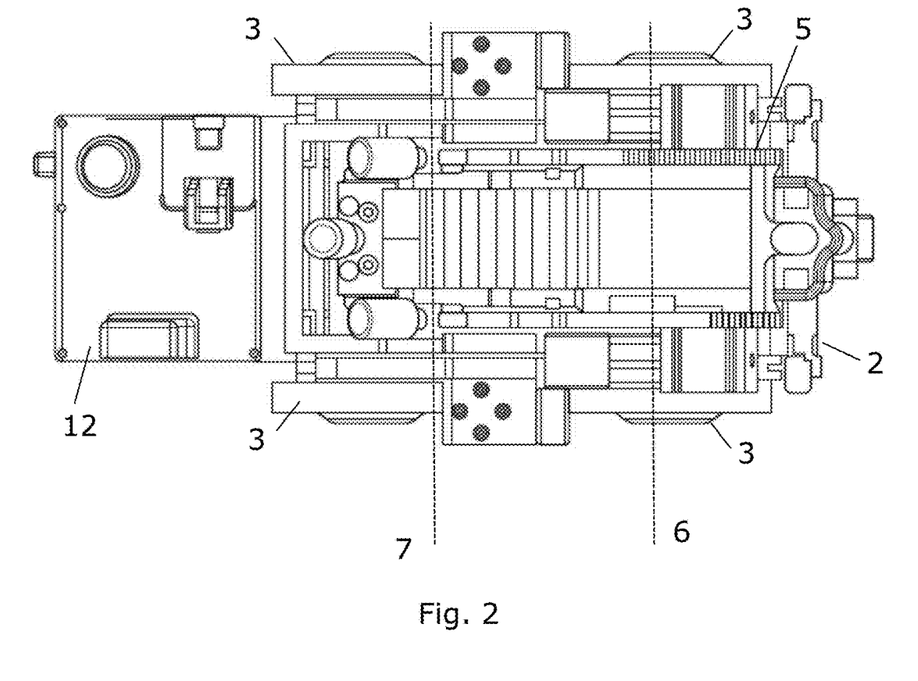
FIG. 2 illustrates the printer and the transfer unit in a top view.

FIG. 1 illustrates a printer 1 for applying a conductive pattern to a surface and FIG. 2 illustrates the printer seen from above. The printer 1 comprises a wheeling structure 2 with wheels 3 for moving the printer over the surface 4. The printer further comprises a transfer unit 5 releasably arranged in the wheeling structure such that it can be removed from the wheeling structure.

Figure 3A:
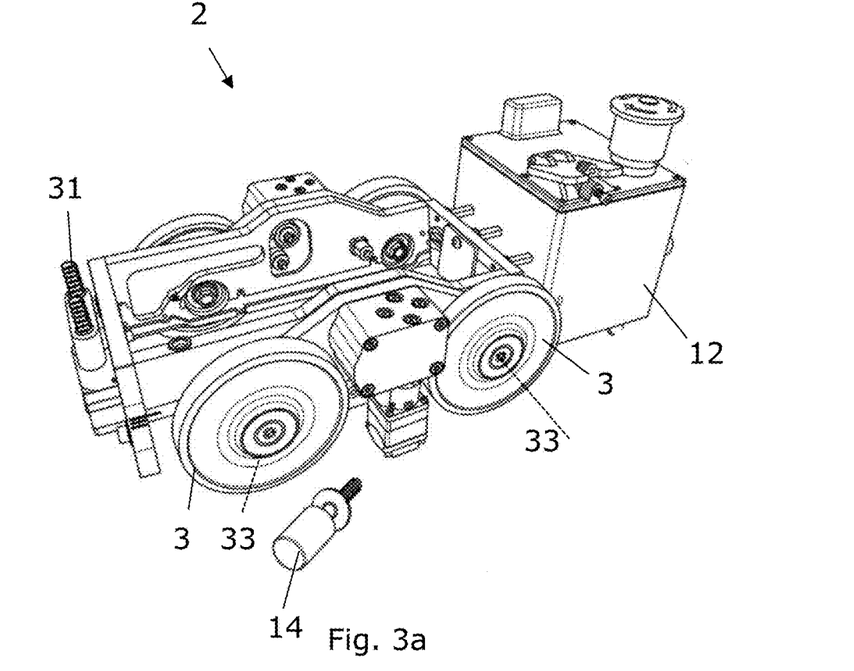
FIGS. 3a-c illustrates the printer disassembled in two main components.
Figure 3B:
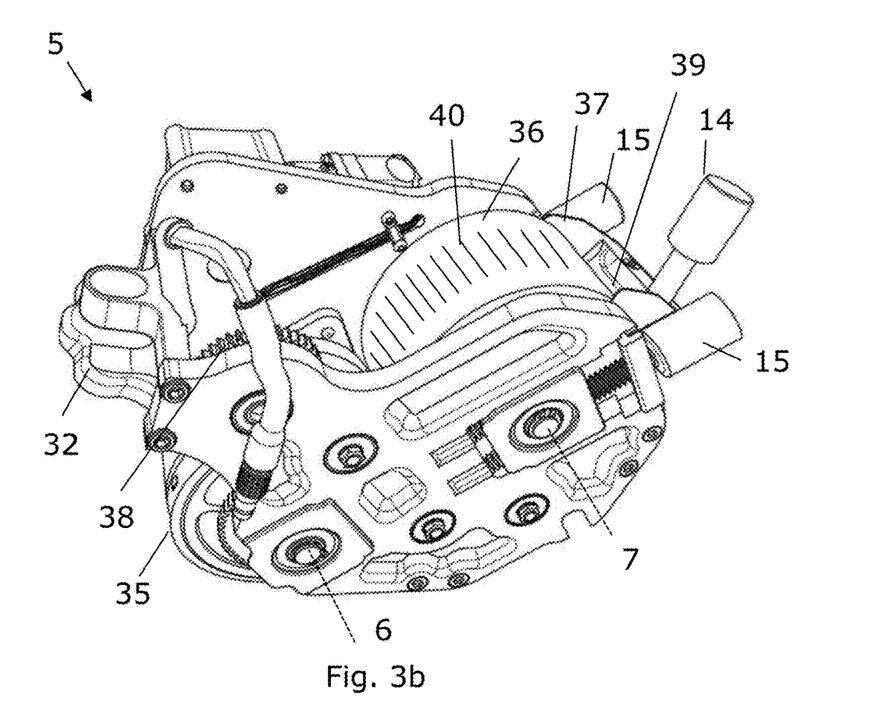

The transfer unit 5 is explained in further details relative to FIGS. 3b (wheeling structure) and 3c (transfer unit) and comprises a printing drum (which is not visible in FIGS. 1 and 2). The printing drum can rotate about a printing drum axis illustrated in FIGS. 1 and 2 by the dotted line 6 (FIG. 2 only). The printing drum has an outer periphery which is configured to receive conductive ink and to transfer the ink to form a conductive pattern on the surface 4. The printer further comprises a transfer drum arranged for rotation about a transfer drum axis illustrated by the dotted line 7 (FIG. 2 only). The transfer drum has a periphery which is configured to receive conductive ink from a reservoir and to transfer the ink to the periphery of the printing drum.

The printer comprises a motor 8 and gear unit 9 for rotating the printing drum and transfer drum, and a motor 10 and gear unit 11 for rotating the wheels 3.

A separate compartment 12 contains a CPU for controlling the motors of the printer. The compartment 12 further comprises a battery for independent operation and power supply and a user interface 13 allowing user interaction.

The distance between the transfer unit 5 and the surface 4 can be adjusted by the adjustment handle 14 lifting the transfer unit 5 relative to the wheeling structure 2. The distance between the printing drum and the transfer drum, i.e. the distance between the printing drum axis and the transfer drum axis can be adjusted by the handle 15.

Figure 3C:
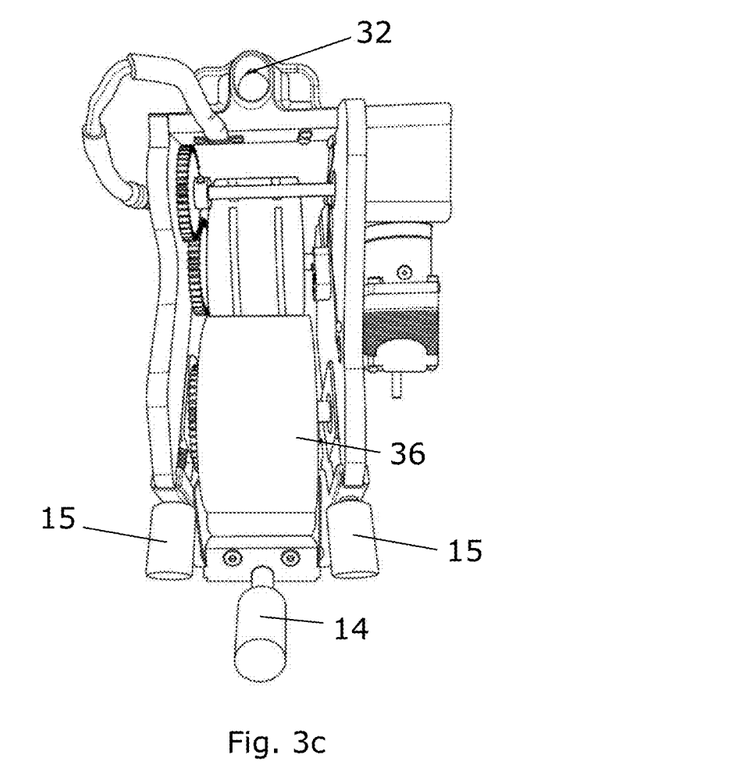

FIGS. 3a-3c illustrates the printer disassembled in two main components, namely a wheeling structure 2 and a transfer unit 3. The wheeling structure carries the transfer unit and electronic components including a battery, a user interface, and a control system.

FIG. 3a illustrates the wheeling structure 2 seen from an opposite side compared to FIG. 1. The wheeling structure includes the compartment 12. The wheeling structure comprises a hinge structure 31 configured to receive a cooperating hinge structure 32 (c.f. FIG. 3b) of the transfer unit 5 and to allow rotation of the transfer unit 5 relative to the wheeling structure 2. The wheels 3 of the wheeling structure 2 rotates about axes 33 which are preferably parallel to the transfer drum axis 7 and to the printing drum axis 6.

The adjustment handle 14 is configured for adjustment of a distance between the surface and the printing drum by lifting one end of the transfer unit relative to the wheeling structure such that the transfer unit rotates about the hinge structure 31. In the disclosed embodiment, the adjustment handle is a screw which is manually operated, but a motor, e.g. a stepper motor, may be applied for motor controlled adjustment of the distance between the printing unit and the surface. The handle 14 thereby constitutes a first distance adjustment means for changing a distance between the surface where the wheeling structure drives and the printing drum periphery and can therefore be used for determining the clearance between the 3-dimensional pattern on the printing drum periphery and the surface on which the conductive pattern is defined.

FIG. 3b illustrates the transfer unit 5 which comprises a printing drum 35 rotatable about the printing drum axis 6 and a transfer drum arranged for rotation about a transfer drum axis 7.

The transfer drum has an outer transfer drum 36 having a periphery moving between a third zone and a fourth zone. At the fourth zone, the transfer drum periphery receives conductive ink from the bath 37. The rotation speed of the printing drum and the transfer drum is synchronised by the toothed wheel 38.

The distance between the printing drum axis and the transfer drum axis can be adjusted by the handles 15. In the disclosed embodiment, the adjustment handles 15 are screws which are manually operated, but a motor, e.g. a stepper motor may be applied for motor controlled adjustment of the distance between the printing unit and the transfer unit.

From the fourth zone, the transfer drum periphery moves, wetted with conductive ink, to the third zone where the ink is transferred to the printing drum periphery. This zone is denoted the first zone of the printing drum periphery. The transferred ink is moved on the printing drum periphery to the second zone of the printing drum periphery, where it is transferred to the surface for defining the conductive pattern. The printing drum comprises a 3-dimensional pattern which defines the conductive pattern.

The transfer unit is, as illustrated by FIGS. 3*a-c* completely removable from the wheeling structure and is kept in place by the adjustment screw 14. The transfer unit comprises a doctor blade 39 arranged to scrape off ink from the transfer drum periphery 36 between the third and fourth zones. The doctor blade forms a wall of the bath 37.

A 3-dimensional print pattern 40 is formed on the transfer drum periphery 36. The print pattern defines elongated conductors extending in an oblong direction which is perpendicular to the direction in which the printer is moving, i.e. the driving direction defined by the layout of the wheels 3. In other embodiments, the oblong direction is parallel to the moving direction defined by the wheels 3.

As an alternative to removing the transfer unit from the wheeling structure, only the printing drum, or optionally, only a surface layer of the printing drum may be removed. In one embodiment, the printing drum comprises a rubber belt with a pattern defining a print pattern and being circumferentially wrapped about a peripheral surface. The print pattern may be replaced by replacing that rubber belt.

The first distance adjustment means changes a distance between the surface of the wheeling structure and the printing drum periphery and can therefore be used for determining the clearance between the 3-dimensional pattern on the printing drum periphery and the surface on which the conductive pattern is defined.

Figure 4:
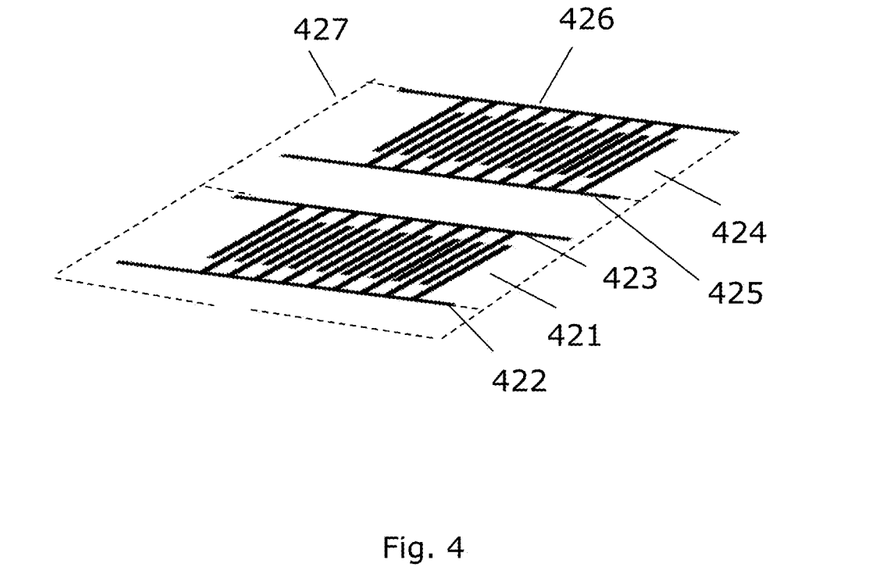
FIG. 4 illustrates an example of a pattern of two electrodes printed by the printer.

FIG. 4 illustrates a printed pattern made by the printer illustrated in FIGS. 1-3. In this case, the pattern is defined by the shape of the printing drum. The pattern defines a first set of electrodes 421 including a first and a second electrode 422, 423 as interleaved conductors and the second set of electrodes 424 defines a third and a fourth electrode 425, 426 as interleaved conductors.

Each pattern is wired by a bus structure 427, to a powering, and signal transmitting CPU-unit (not illustrated. The bus structure is also printed by use of the printer.

Figure 5:
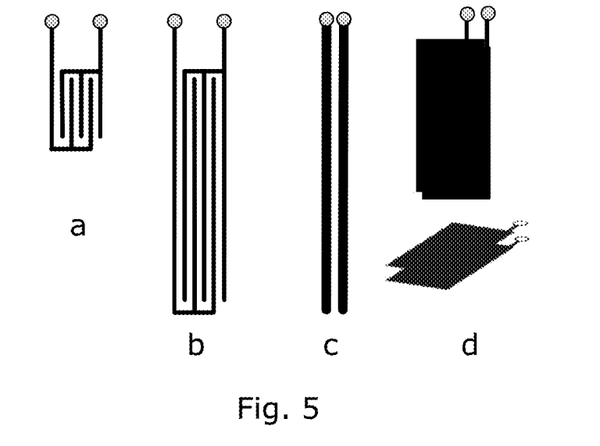
FIGS. 5-9 illustrate further examples of patterns of electrodes.

FIG. 5 illustrates four different sensors each comprising 2 electrodes, i.e. a 2-electrode pattern. This type of sensor is suitable for detecting coating degradation, corrosion, and water detection e.g. by EIS. Sensors a and b form comb patterns with interleaved fingers. The number of fingers of the comb and the spacing may vary. Sensor c forms oblong parallel lines. The spacing between the lines may vary. The sensor d forms plate shaped electrodes arranged at a distance which may vary. The plates may be in different layers of the coating, e.g. applied between different coating layers. The plates may be applied with or without insulating layers in between.

Figure 6:
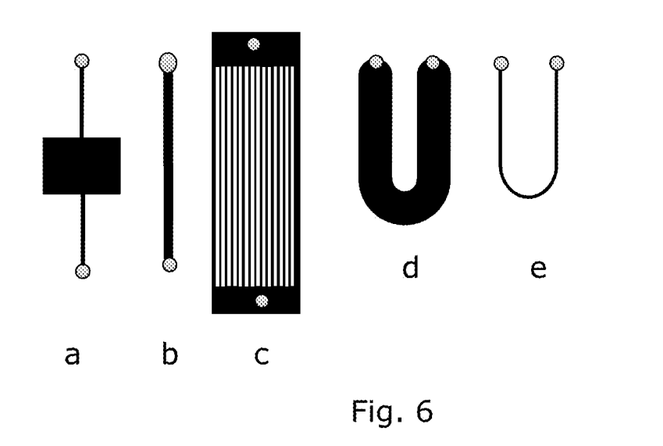

FIG. 6 illustrates 5 different sensors each comprising one single electrode, i.e. a 1-electrode pattern. The 1 electrode pattern is suitable for detecting cracking e.g. by detecting a change in conductivity caused by partial or complete interruption of the electrode.

Sensors b, d, and e are long sensors in 1 dimension. It can be e.g. from a few centimetres up to several meters. It is suitable for cracking detection where a crack in the coating may destruct the electrode and thereby create a very significant increase in resistance from one end of the electrode to the opposite end of the electrode.

Sensors a and c are two dimensional sensors including one single electrode and they are suitable for area mapping, e.g. from 0.1 square metre up to several square metre. This type of sensor is particularly suitable for stress and strain detection.

The 1 electrode pattern sensor can be combined with the 2-electrode pattern to obtain a combined sensing of different aspects of the coating, inter alia water content, corrosion, or coating degradation.

Figure 7:
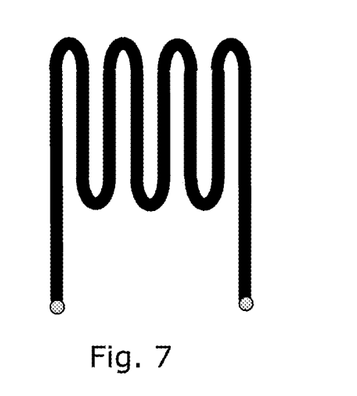
Figure 8:
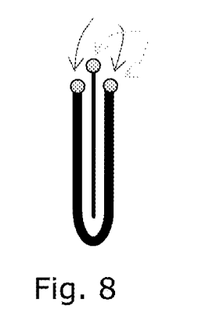
Figure 9:
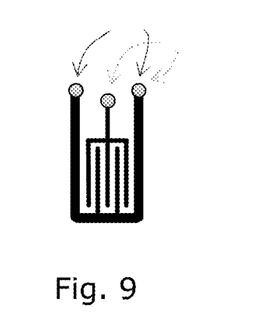

FIG. 7 illustrates a particular embodiment of a 1-electrode pattern with a meandering shape which is suitable for stress sensing. FIGS. 8 and 9 illustrate a 2-electrode pattern suitable for degradation, water detection, corrosion detection and cracking, all in one sensor. The combined impedance and resistance is possible with three electrode connection points, forming three electrodes by only two separate lines.

Figure 10A:
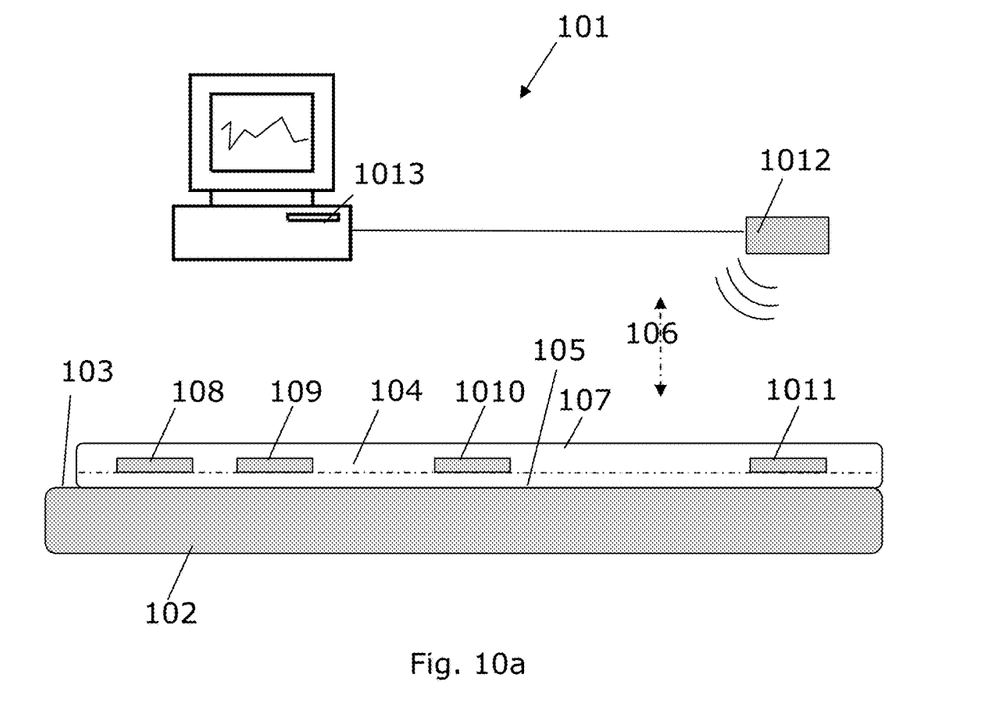
FIGS. 10a and 10b illustrate a structure with coating and a sensor embedded in the coating e.g. by printing on a layer of cured coat or printed on the surface of the base and subsequently covering the printed pattern with another coating layer.
Figure 10B:
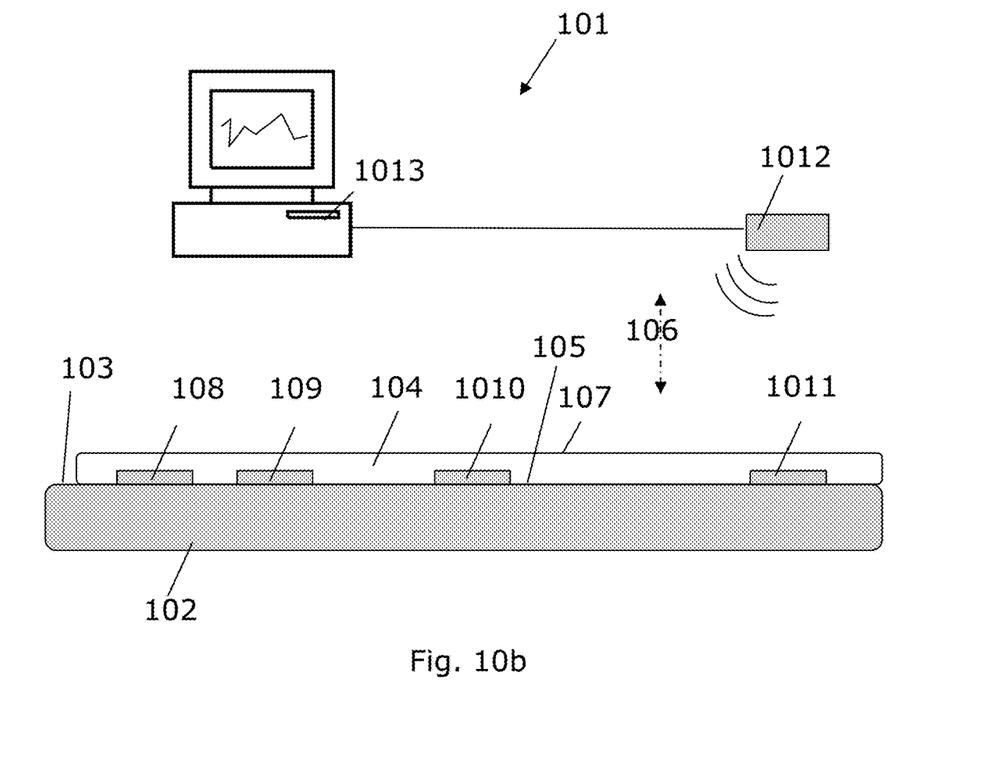

FIGS. 10*a* and 10*b* illustrate a coated structure 101 with monitoring capabilities. The coated structure comprises a base 102 made for example of steel. The base has a base surface 103 which is protected by coating 104. The coating is joined to the base surface in a base interface 105, and the coating extends in a thickness direction illustrated by the arrow 106 and thereby forms a thickness of the coating. The coating forms an outer coating surface 107 facing away from the base 102.

A sensor comprising four electrodes 108, 109, 1010, 1011 is embedded in the coating or printed on the surface of the base. The potentiostat 1012 communicates an AC signal with the sensor by inducing a signal into the sensor and reading an output signal from the sensor. The potentiostat forms an I/O device. The I/O device may be in wired connection with the electrodes of the sensor, or, as illustrated in FIG. 1, it may communicate wirelessly with the electrodes. Wireless communication enables complete embedment of the sensor in the coating and thereby provides a more robust system.

The I/O device communicates electrical signals with the computer unit 1013, and the computer unit is configured to derive a condition of the coating, a condition of the base, or a condition of the base interface from the electrical signal from the sensor.

In FIG. 10*a*, the electrodes are embedded in the coating. This is obtained by applying a layer of coating on the surface of the base, printing the electrodes on the cured coating, and applying another layer of coating on the cured coating and electrodes. The interface between the two layers of coating is indicated by the dotted horizontal line.

In FIG. 10*b*, the electrodes are printed on the surface of the base before the coating is applied.

LIST OF NUMBERED EMBODIMENTS

1. A printer (1) for applying a conductive pattern to a surface (4), the printer comprising a wheeling structure (2) for moving the printer over the surface and a transfer unit (5) for applying a layer of electrically conductive ink to the surface, wherein the transfer unit (5) comprises a printing drum (35) being rotatable about a printing drum axis (6) and defining an outer printing drum periphery moving between a first zone and a second zone by rotation of the printing drum, wherein the printing drum periphery, in the first zone receives the conductive ink and in the second zone transfers the ink to the surface.

2. The printer according to embodiment 1, wherein the transfer unit (5) comprises a transfer drum (36) arranged for rotation about a transfer drum axis (7), the transfer drum defining an transfer drum periphery moving between a third zone and a fourth zone, the fourth zone being wetted by a bath (37) comprising the conductive ink and the third zone being in communication with the first zone of the printing drum to transfer ink from the transfer drum (36) to the printing drum (35).

3. The printer according to embodiment 2, further comprising a doctor blade (39) arranged to scrape off ink from the transfer drum periphery between the third and fourth zones.

4. The printer according to any of the preceding embodiments, comprising a first distance adjustment means (14) configured for defining a distance between surface and the printing drum periphery.

5. The printer according to embodiment 4, wherein the first distance adjustment means (14) is arranged to change a distance between the wheeling structure and the printing drum.

6. The printer according to any of embodiments 2-5, comprising a second distance adjustment means (15) configured for defining a distance between the printing drum periphery and the transfer drum periphery.

7. The printer according to any of embodiments 2-6, comprising a third distance adjustment means configured for defining a distance between the doctor blade and the transfer drum periphery.

8. The printer according to any of the preceding embodiments, comprising magnetic or pneumatic attraction means for establishing attraction between the printer and the surface.

9. The printer according to any of embodiments 2-8, wherein the distance between a mass-centre point and a geometrical centre point of the printer is lower than the distance between the printing drum axis and the transfer drum axis.

10. The printer according to any of the preceding embodiments, wherein the transfer unit is removable as one component from the wheeling structure.

11. The printer according to any of the preceding embodiments, wherein the printing drum includes a reference mark and wherein rotation of the printing drum is controlled by a printing controller configured to adjust the position of the printing drum based on the reference mark.

12. The printer according to any of the preceding embodiments, wherein the wheeling structure comprises a set of wheels each being rotatable about a rotation axis, and wherein each wheel can be tilted about a tilt axis perpendicular to the rotation axis.

13. The printer according to embodiment 12, comprising indication marks indicating a degree of tilting of the wheels about the tilt axis.

14. The printer according to any of the preceding embodiments, further comprising a control system configured to move the printer in a controllable path.

15. The printer according to any of the preceding embodiments, further comprising a control system configured to control a rotation speed for at least one of the wheels individually.

16. The printer according to any of the preceding embodiments, comprising curing means configured to cure the ink at the second zone.

17. The printer according to any of the preceding embodiments, including conductive ink.

18. The printer according to any of the preceding embodiments, comprising a 3-dimensional print pattern formed on at least one of the transfer drum and the printing drum periphery.

19. The printer according to claim 18, wherein the 3-dimensional print pattern defines at least a first electrode and a second electrode, the first and the second electrodes being defined such that they are separated from each other.

20. The printer according to any of claim 18 or 19, wherein the 3-dimensional print pattern defines elongated conductors extending in an oblong direction, and wherein the wheeling structure comprises wheels arranged to moving the printer in the oblong direction.

21. The printer according to any of claim 18 or 19, wherein the 3-dimensional print pattern defines elongated conductors extending in an oblong direction, and wherein the wheeling structure comprises wheels arranged to moving the printer in a direction perpendicular to the oblong direction.

22. The printer according to any of claims 19-21, comprising an application structure configured for filling the 3-dimensional print pattern with the conductive ink.

23. The printer according to claim 22, wherein the application structure is configured for filling the 3-dimensional print pattern with liquid conductive ink.

24. The printer according to embodiment 18-23, wherein the printing drum comprises a removable rubber belt defining the print pattern, the rubber belt being circumferentially wrapped about a peripheral surface of the printing drum.

25. The printer according to embodiment 18-24, comprising a print quality inspection system configured to control online if the first electrode is separate from the second electrode.

26. The printer according to embodiment 25, wherein the print quality inspection system is configured to control online if a distance between the first electrode and the second electrode is within a predefined threshold.

27. The printer according to any of the embodiments 23-26, wherein the print quality inspection system comprises a camera or a multi-meter.

28. The printer according to any of embodiments 2-27, wherein the printing drum periphery is made from a first material and the transfer drum periphery is made from a different, second material.

29. The printer according to any of embodiments 2-28, wherein the printing drum periphery has a first elasticity, the transfer drum periphery has a second elasticity, and the first elasticity is higher than the second elasticity.

30. The printer according to any of embodiments 2-29, wherein the printing drum periphery has a first coefficient of friction, the transfer drum periphery has a second friction coefficient, and the first friction coefficient is higher than the second friction coefficient.

31. The printer according to any of embodiments 2-30, wherein the printing drum periphery has a first porosity, the transfer drum periphery has a second porosity, and the second porosity is higher than the first porosity.

32. The printer according to any of embodiments 2-31, wherein the printing drum periphery has a first durometer hardness, the transfer drum periphery has a second durometer hardness, and the second durometer hardness is higher than the first durometer hardness.

33. The printer according to any of the preceding embodiments, wherein said printer does not comprise an inkjet nozzle.

34. The printer according to any of the preceding embodiments and configured for printing with conductive ink.

35. A method of applying a pattern of electrically conductive ink to a surface by use of the printer according to-any of embodiments 1-34, wherein a first and a second separate electrode are formed by electrically conductive ink which is transferred to the surface by the printing drum.

36. The method according to embodiment 35, wherein the ink is cured and the separation of the first electrode from the second electrode is tested by the printer.

37. The method according to embodiment 35 or 36, wherein the ink is applied to a surface of a base which is subsequently covered by coating.

38. The method according to embodiment 35-37, wherein the ink is applied to a surface of a layer of cured coat which has been applied on a base, and wherein the layer of cured coat and the ink is subsequently covered by coating.

39. An electrically conductive pattern comprising a first electrode and a second electrode, the first and second electrodes being separate from each other, and the pattern being applied by a printer according to any of embodiments 1-34.

The invention claimed is:

1. A printer configured for printing with conductive ink for applying a conductive pattern to a surface, the printer comprising a wheeling structure for moving the printer over the surface and a transfer unit for applying a layer of electrically conductive ink to the surface,
   wherein the transfer unit comprises a printing drum being rotatable about a printing drum axis and defining an outer printing drum periphery moving between a first zone and a second zone by rotation of the printing drum,
   wherein the printing drum periphery, in the first zone receives the conductive ink and in the second zone transfers the ink to the surface.

2. The printer according to claim 1, wherein the transfer unit comprises a transfer drum arranged for rotation about a transfer drum axis, the transfer drum defining an transfer drum periphery moving between a third zone and a fourth zone, the fourth zone being wetted by a bath comprising the conductive ink and the third zone being in communication with the first zone of the printing drum to transfer ink from the transfer drum to the printing drum.

3. The printer according to claim 2, comprising second distance adjustment means configured for defining a distance between the printing drum periphery and the transfer drum periphery.

4. The printer according to claim 2, wherein the distance between a mass-centre point and a geometrical centre point of the printer is lower than the distance between the printing drum axis and the transfer drum axis.

5. The printer according to claim 2, wherein the printing drum periphery is made from a first material and the transfer drum periphery is made from a different, second material.

6. The printer according to claim 2, wherein the printing drum periphery has a first elasticity, the transfer drum periphery has a second elasticity, and the first elasticity is higher than the second elasticity.

7. The printer according to claim 2, wherein the printing drum periphery has a first coefficient of friction, the transfer drum periphery has a second friction coefficient, and the first friction coefficient is higher than the second friction coefficient.

8. The printer according to claim 1, comprising a 3-dimensional print pattern formed on at least one of the transfer drum and the printing drum periphery.

9. The printer according to claim 8, wherein the 3-dimensional print pattern defines elongated conductors extending in an oblong direction, and
   wherein the wheeling structure comprises wheels arranged to moving the printer in the oblong direction or in a direction perpendicular to the oblong direction.

10. The printer according to claim 1, comprising first distance adjustment means configured for defining a distance between surface and the printing drum periphery.

11. The printer according to claim 10, wherein the first distance adjustment means is arranged to change a distance between the wheeling structure and the printing drum.

12. The printer according to claim 1, comprising magnetic or pneumatic attraction means for establishing attraction between the printer and the surface.

13. The printer according to claim 1, wherein the transfer unit is removable as one component from the wheeling structure.

14. The printer according to claim 1, wherein the wheeling structure comprises a set of wheels each being rotatable about a rotation axis, and
   wherein each wheel is tiltable about a tilt axis perpendicular to the rotation axis.

15. A method of applying a pattern of electrically conductive ink to a surface by use of the printer according to claim 1,
   wherein a first and a second separate electrode are formed by electrically conductive ink which is transferred to the surface by the printing drum.

* * * * *